US009235425B2

(12) United States Patent
Kalte

(10) Patent No.: US 9,235,425 B2
(45) Date of Patent: Jan. 12, 2016

(54) RANDOM ACCESS TO SIGNAL VALUES OF AN FPGA AT RUNTIME

(71) Applicant: dSPACE digital signal processing and control engineering GmbH, Paderborn (DE)

(72) Inventor: Heiko Kalte, Paderborn (DE)

(73) Assignee: dSPACE digital signal processing and control engineering GmbH, Paderborn (DE)

(*) Notice: Subject to any disclaimer, the term of this patent is extended or adjusted under 35 U.S.C. 154(b) by 0 days.

(21) Appl. No.: 14/177,583

(22) Filed: Feb. 11, 2014

(65) Prior Publication Data

US 2014/0229723 A1 Aug. 14, 2014

Related U.S. Application Data

(60) Provisional application No. 61/763,157, filed on Feb. 11, 2013.

(30) Foreign Application Priority Data

Feb. 11, 2013 (EP) ..................................... 13154741

(51) Int. Cl.
*G06F 17/50* (2006.01)
*G06F 9/44* (2006.01)
(52) U.S. Cl.
CPC .......... *G06F 9/4401* (2013.01); *G06F 17/5027* (2013.01); *G06F 17/5054* (2013.01)
(58) Field of Classification Search
CPC .................................................. G06F 17/5054
USPC .......................................................... 716/116
See application file for complete search history.

(56) References Cited

U.S. PATENT DOCUMENTS

| 5,425,036 | A  | * | 6/1995  | Liu et al. ........................ 714/735 |
| 6,453,456 | B1 | * | 9/2002  | Price ............................. 716/117 |
| 6,922,665 | B1 | * | 7/2005  | Guccione et al. ................ 703/14 |
| 7,240,303 | B1 | * | 7/2007  | Schubert et al. .............. 716/106 |
| 7,546,572 | B1 | * | 6/2009  | Ballagh et al. ................ 716/138 |
| 7,827,510 | B1 | * | 11/2010 | Schubert et al. .............. 716/136 |

(Continued)

OTHER PUBLICATIONS

International Search Report for PCT Application No. PCT/EP2014/05625 dated Sep. 18, 2014 with English translation.

(Continued)

*Primary Examiner* — Suresh Memula
(74) *Attorney, Agent, or Firm* — Muncy, Geissler, Olds & Lowe, P.C.

(57) ABSTRACT

A method for accessing a signal value of an FPGA at runtime, including the steps of loading an FPGA hardware configuration into the FPGA, executing the FPGA hardware configuration in the FPGA, requesting a signal value of the FPGA, sending status data from a functional level of the FPGA to a configuration memory in its configuration level, reading the status data from the configuration memory as readback data, and determining the signal value of the readback data. A method is also provided for making an FPGA build, based on an FPGA model, using a hardware description language, including the steps of creating an FPGA hardware configuration, identifying memory locations of a configuration memory for status data of at least one signal value based on the FPGA hardware configuration, and creating a list with signal values accessible at runtime and the memory locations corresponding thereto.

10 Claims, 8 Drawing Sheets

(56) References Cited

U.S. PATENT DOCUMENTS

| | | | |
|---|---|---|---|
| 8,250,503 B2* | 8/2012 | Vorbach et al. | 716/104 |
| 8,352,229 B1* | 1/2013 | Ma et al. | 703/13 |
| 8,930,876 B2* | 1/2015 | Pell et al. | 716/136 |
| 2002/0010902 A1* | 1/2002 | Chen et al. | 716/16 |
| 2003/0105620 A1* | 6/2003 | Bowen | 703/22 |
| 2006/0117274 A1* | 6/2006 | Tseng et al. | 716/1 |
| 2009/0019416 A1 | 1/2009 | Chugh et al. | |

OTHER PUBLICATIONS

Aguirre et al., "Improving the Design Process of VLSI Circuits by Means of a Hardware Debugging Systems: UNSHADES-1 Framework," Proc. of the 28$^{th}$ Ann. Conf. of the IEEE Ind. Elec. Soc., pp. 2544-2547 (Nov. 5, 2002).

Virtex Series Configuration Architecture User Guide, http://www.xilinx.com/support/documentation/application_notes/xapp151.pdf, pp. 1-45 (Oct. 1, 2004).

Partial European Search Report for European Application No. 13154741.6 dated Jul. 11, 2013 with English translation.

European Search Report for European Application No. 13154741 dated Aug. 26, 2013 with English translation.

German Search Report for German Application No. 10 2013 101 300.7 dated Sep. 17, 2013 with English translation.

Xilinx, "Virtex FPGA Series Configuration and Readback," XAPP138 (v.2.8), pp. 1-37 (Mar. 11, 2005).

Aguirre et al., "UNSHADES-1: An Advanced Tool for In-System Run-Time Hardware Debugging," Field Programmable Logic and of Application, vol. 2778, pp. 1170-1173 (Jan. 1, 2003).

Tombs et al., "The Implementation of a FPGA Hardware Debugger System with Minimal System Overhead," Field Programmable Logic and of Application, vol. 3203, pp. 1062-1066 (Jan. 1, 2004).

Graham et al., "Improving the FPGA Design Process Through Determining and Applying Logical-to-Physical Design Mappings," http://www.dtic.mil/cgi-bin/GetTRDoc?AD=ADA451583, pp. 1-12 (Jan. 1, 2000).

Monmasson et al., "FPGAs in Industrial Control Applications," IEEE Trans. on Industrial Informatics, vol. 7, No. 2, pp. 224-243 (May 2, 2011).

Xilinx Development System Reference Guide, http://www.xilinx.com/itp/xilinx10/books/docs/dev/dev.pdf, pp. 1, 48, 333 and 482 (Jan. 31, 2012).

Paiz et al., FPGA-in-the-Loop-Simulations for Dynamically Reconfigurable Applications, IEEE Conf. on Field Programmable Technology, pp. 372-375 (2009).

Knittel et al., "Integrating Logic Analyzer Functionality into VHDL Designs," IEEE 2008 Int'l Conf. on Reconfig. Comp. & FPGAs, pp. 127-132 (2008).

Ehliar et al., "Using Partial Reconfigurability to Air Debugging of FPGA Designs," IEEE, pp. 215-220 (2011).

Arshak et al., "Testing FPGA based digital system using XILINX ChipScope™ logic analyzer," IEEE 2006 ISSE, pp. 355-360 (2006).

ChipScope Pro 11.1 Software and Cores User Guide, UG029 (v.11.1), pp. 1-211 (Apr. 24, 2009).

Paulsson et al., "Exploitation of the External JTAG Interface for Internally Controlled Configuration Readback and Self-Reconfiguration of Spartan 3 FPGAs," IEEE Comp. Soc. Annl Symp. on VLSI, pp. 304-309 (2008).

Khan et al., "gNOSIS: A Board-level Debugging and Verification Tool," Technical Report, Microsoft Corporation, pp. 1-9 (Jul. 2010).

7 Series FPGAs Configuration User Guide, UG470 (v.1.3), pp. 1-136 (Feb. 14, 2012).

Xilinx Partial Reconfiguration Guide, UG702 (v.13.3), pp. 1-128 (Oct. 19, 2011).

* cited by examiner

RANDOM ACCESS TO SIGNAL VALUES OF AN FPGA AT RUNTIME

This nonprovisional application claims priority to European Patent Application No. EP 13154741.6, which was filed on Feb. 11, 2013, and to U.S. Provisional Application No. 61/763,157, which was filed on Feb. 11, 2013, and which are both herein incorporated by reference.

BACKGROUND OF THE INVENTION

1. Field of the Invention

The present invention relates to a method for accessing a signal value of an FPGA at runtime. Likewise, the invention relates to a data processing device with a processor unit and an FPGA, whereby the data processing device is configured to carry out the above method. The invention also relates to a computer program product with computer-implemented instructions, said product which after loading and execution in a suitable data processing device performs the steps of the above method, and a digital storage medium with electronically readable control signals, which can interact with a programmable data processing device, so that the above method is executed. Finally, the present invention comprises a method for making an FPGA build based on an FPGA model using a hardware description language.

2. Description of the Background Art

The real-time simulation of complex, dynamic models because of the narrow time constraints imposes high demands on modern computation nodes. In automotive hardware-in-the-loop simulations (HiL), such models are used primarily where rapid control loops must be closed. This is the case, for instance, in the simulation of in-cylinder pressure sensors, which play an increasingly greater role in fuel consumption or exhaust gas reduction. But in controlled systems as well which have high dynamics, such as, for example, in electric motors, short cycle times and low latencies are indispensable. These can hardly be implemented any longer with CPU-based simulations.

Field programmable gate arrays (FPGAs) can support computation nodes during real-time simulation in that they take over the calculation of dynamic parts of a model. High real-time requirements can be easily met by using FPGAs because of the high flexibility and the possibility of parallel processing of signals. The FPGAs can be used as hardware accelerators for the CPUs of computation nodes. The DS5203-FPGA board from dSPACE, for example, represents such an enhancement for a HiL simulator. Accordingly, e.g., very dynamic parts of the environmental model are outsourced to the FPGA, so that sufficiently precise and rapid reaction times are preserved for the control device. An FPGA hardware configuration is typically generated based on an FPGA model using a hardware description language in a build process.

The models of a control system have become increasingly more complex because of more stringent requirements for accuracy and therefore also difficult to manage. In the automotive HiL environment, such models are created as a rule with the MATLAB/Simulink toolset from The MathWorks Inc. Simulink offers a block-based view of such models in the form of a block diagram. In a block diagram model, parts can be combined into subsystems and linked together with signals. The data flow between these blocks is shown by signal lines.

In a CPU-based real-time simulation, the block diagram of a model is first converted into C/C++ source files with the aid of the Simulink coder. These are then converted using a compiler into an executable application, which can be executed on a computation node with a real-time-capable operating system. In addition, in the case of the CPU build a trace file is generated which is a topology file with its graphical modeling, for example, in Simulink.

The conversion of a model into a CPU application has the result that the calculations of the simulation are performed sequentially in a fixed step size. A consistent image of all model states or model variables, such as, for example, data in the signal lines or input/output values of the blocks, is therefore always present in the main memory of the computation node. Due to the direct access to the main memory, the model variables can be analyzed and/or manipulated using an experimentation tool such as, for example, ControlDesk. Random read/write access to variables of the HiL simulation is possible. By using the trace files, signal values such as, e.g., motor rotation speed can be selected and output or manipulated by a display. In the HiL environment, these processes are grouped under the term "measuring" and "calibrating."

An FPGA-based simulation can be modeled in a block diagram with Simulink with the aid of the Xilinx System Generator (XSG) and the FPGA Programming Blockset from dSPACE, similar to a CPU-based simulation.

In contrast to the CPU simulation, this model however is not converted into an iterative program language but into a hardware description language, which describes a customer-specific digital circuit. The description of the customer-specific circuit is converted by a synthesis process into an FPGA configuration data stream.

For debug purposes it is possible for some FPGAs to freeze and read the complete state of the FPGA. Because of the closed input/output behavior of the FPGA, it is not possible, however, in analogy to the main memory of a computation node to access any model states and to change these if necessary. Each model variable, which the user would like to measure or calibrate, must be provided by explicit modeling via signal lines to the interfaces of the FPGA. After this adjustment, the model must be converted again, which can take several hours. This circumstance can lead to very long development cycles of FPGA-based real-time simulations.

SUMMARY OF THE INVENTION

It is therefore an object of the present invention to provide a method, a data processing device, a computer program product, and a digital storage medium with electronically readable control signals of the aforementioned type, which enable access to model variables in the FPGA at runtime and a shortening of iterative development cycles in the creation of FPGA-based real-time simulations.

According to an embodiment of the invention, a method for accessing a signal value of an FPGA at runtime is provided, comprising the steps of loading an FPGA hardware configuration into the FPGA, executing the FPGA hardware configuration in the FPGA, requesting a signal value of the FPGA, sending status data from a functional level of the FPGA to a configuration memory in its configuration level, reading of status data from the configuration memory as readback data, and determining the signal value of the readback data.

According to an embodiment of the invention, further a data processing device with a processor unit and an FPGA is provided, whereby the data processing device is configured to carry out the above method.

According to an embodiment of the invention, a computer program product with computer-implemented instructions is also provided, said product which after loading and execution in a suitable data processing device performs the steps of the above method.

Furthermore, according to an embodiment of the invention a digital storage medium with electronically readable control signals is provided, which can interact with a programmable data processing device, so that the above method is executed in the data processing device.

In an embodiment, access to the signal value of the FPGA is enabled at runtime in that during the operation of the FPGA status data are read from the FPGA and the signal value is determined therefrom. The status data are read and combined as required, whereby structural changes to the FPGA are not necessary. Interruption of the operation of the FPGA is also not necessary. Thus, signal values of the FPGA can be accessed randomly. Access to the signal values can occur as known from the execution of software, including access via topology files (trace file) and a graphical modeling with Simulink. Signal values such as, e.g., a motor rotation speed can be selected accordingly and displayed or manipulated.

Advantageously, no changes are necessary for implementing the FPGA, so that the need for resources and performance of the FPGA is unchanged. Accordingly, access to the signal value has no effect on normal operation, neither in regard to the generated FPGA hardware configuration nor during execution. States of different model variables can be stored consistently in order to enable access. Access to desired signal values can occur without an adapted FPGA hardware configuration having to be generated and sent to the FPGA, as a result of which development times can be shortened. An effect on available resources and the real-time behavior of the FPGA is avoided or reduced. In particular, different signal values can be read from the FPGA as required without a change to the FPGA hardware configuration.

The configuration level relates to a logic level of the FPGA, which is used for initializing the FPGA. During an initial configuration process, the configuration data are written in the configuration memory, as a result of which the function level subsequently behaves as modeled. During the operation, all register contents of the functional level can then be mirrored back to the configuration level, e.g., by a trigger. The content of the configuration memory can then be read in order to determine the signal value from it. The selection of the signal value can be changed arbitrarily during runtime. Preferably, access to a plurality of signal values occurs.

The readback data can contain any data unit of the FPGA. The readback data can comprise individual register values or larger memory blocks of the FPGA. The memory blocks can be, for example, readback columns of the FPGA.

Principally, the sequence of the indicated method can vary and is not limited to the sequence given here.

The data processing device can be configured basically as desired. The FPGA is typically arranged as an add-on module in the data processing device or connected to it. The data processing device can be connected to a remote control computer via a data connection. Especially preferably, access to the signal value occurs via an application in the control computer.

The presentation of the signal value can occur as a graphical presentation. In this regard, the signal value preferably can be dragged from a list by "drag and drop" to shown instruments for displaying signal values.

The reading of status data from the configuration memory as readback data involves no changing of the data, but relates only to a conceptual definition.

The determination of the signal value from the readback data can occur basically at any location, for example, in the FPGA, CPU of the data processing device, or the control computer. Accordingly, the status data, register data, or the signal value can be transmitted as necessary.

Access to the configuration memory of the FPGA from outside or within the FPGA occurs via an interface. A typical architecture of the configuration memory comprises an interface with a 32-bit width and a clock frequency of 100 MHz with a minimal read amount of a single frame. Therefore, it is not possible to use the method in terms of an FPGA debugger or FPGA scope with cycle-accurate access in the FPGA clock with currently conventional FPGAs. A frame can contain, apart from register values, information on a look-up table and on multiplexer or wiring configuration. The determination of the signal value from the readback data comprises preferably finding and extracting of register values from a frame.

In an embodiment of the invention, the step of determining the signal value from the readback data comprises mapping the readback data to at least one register value. Registers are memories at the functional level, whose data are simply copied and can be used to determine the signal value. This enables the identification of the data for determining the signal value.

In an embodiment of the invention, the step of determining the signal value from the readback data comprises determining the signal value from at least one register value. The organization of the signal value in the at least one register can be arbitrary, which is why the register contents must be processed in order to determine the signal value. In particular, the signal value can be distributed to a plurality of registers, and the contents of the registers are processed together, in order to determine the signal value.

In an embodiment of the invention, the step of reading the status data from the configuration memory as readback data comprises identifying configuration memory areas necessary for determining the signal value and reading the status data of the necessary areas of the configuration memory as readback data. Areas to be read are identified at runtime, so that access to the configuration memory can occur without prior adaptations of the FPGA hardware configuration. By identifying the necessary areas, the reading of the status data can be limited to these areas, as a result of which few data need to be read, sent, and processed.

In an embodiment of the invention, the step of sending status data from a functional level of the FPGA to a configuration memory in its configuration level comprises identifying the status data parts necessary for determining the signal value and backing up these parts of the status data in its configuration memory. The areas to be sent are identified at runtime, so that the sending of status data can occur without prior modifications of the FPGA hardware configuration. By identifying the necessary areas, the backing up of status data can be limited to these areas, as a result of which few data need to be backed up.

In an embodiment of the invention, the step of requesting a signal value of the FPGA comprises providing a list of available signal values and selecting a signal value from said list. The list can basically be created at any time. Preferably, the list is created with use of a model of the FPGA hardware configuration. Especially preferably, each signal value is assigned a unique identification number by which the access occurs.

In an embodiment of the invention, the method comprises setting a signal value for sending to the FPGA, determining write-back data from the signal value, writing the write-back data as status data in the configuration memory of the FPGA, and sending the status data from the configuration memory to the functional level of the FPGA. A write access results in analogy to the previously described read access to the FPGA. Said access also occurs at runtime without affecting the FPGA. The previously described details on read access to the FPGA can be used individually accordingly for the write access.

A dynamic, partial reconfiguration of the FPGA therefore occurs, whereby the particularly relevant parts in the FPGA are overwritten. In this regard, for example, a Simulink constant block must be mapped to a reconfigurable look-up table. These can then be used by means of partial, dynamic reconfiguration for changing any signal value.

In the sending of the status data to the functional level of the FPGA, the write-back data on the signal value can comprise additional information. Therefore, preferably first the status data are read as a basis for the write-back data, and the signal value is inserted in these status data. The data integrity of the FPGA is assured thereby.

According to an embodiment of the invention, furthermore, a method for making an FPGA build, based on an FPGA model using a hardware description language, is provided, comprising the steps of creating an FPGA hardware configuration, identifying memory locations of a configuration memory for status data of at least one signal value based on the FPGA hardware configuration, and creating a list with signal values accessible at runtime and the memory locations corresponding thereto.

The basic idea of this method, therefore, is to collect via signal values the data necessary in the creation of an FPGA hardware configuration and to process them in such a way that the signal value based on the collected status data can be formed at runtime of the FPGA.

Memory locations can be registers of the FPGA. Registers can be explicitly modeled in the model or, for example, be implicitly modeled by blocks with delay. The model is preferably generated graphically.

The sequence of the indicated method can basically vary and is not limited to the sequence given here. For example, the creation of a list with signal values accessible at runtime proceeding from the model using the hardware description language can occur at an earlier time.

The method provided here for making an FPGA build can be part of a build process for a data processing device with an FPGA, whereby the data processing device comprises the FPGA or is connected to it. In this method, in addition a build for the CPU of the data processing device is made, whereby generation of a CPU trace file occurs in a CPU trace file generator. In addition, the list with signal values accessible at runtime and the memory locations corresponding thereto, which is called a "logic allocation file" here, is converted to a machine-readable file. In addition, a trace file for the FPGA is generated equivalent to the trace file of the CPU. In a further step, the trace files of the CPU and FPGA are merged in a trace file merger. As a result, for example, access to signal values by a control computer can occur independent of the implementation for execution in the CPU or the FPGA.

In an embodiment of the invention, the step of creating a list with accessible signal values and the memory locations corresponding thereto comprises identifying a linking of the memory locations for the formation of the signal value. The list therefore contains specific information on how a signal value is determined from status data.

In an embodiment of the invention, the method comprises the additional step of generating an FPGA code for determining a signal value, whereby the FPGA code comprises reading status data from the configuration memory as readback data and determining the signal value from the readback data based on the list with readable signal values and the memory locations corresponding thereto. A subsequent processing of the status data for determining the signal value can therefore be carried out totally in the FPGA. Accordingly, only the determined signal value is to be sent by the FPGA, which unburdens its interface.

In an embodiment of the invention, the method comprises the additional step of optimizing the FPGA hardware configuration with the arrangement of memory locations, containing status data for a signal value, in a readback column of the FPGA. The arrangement in a readback column accelerates access to the status data for a signal value. If all memory locations for a signal value are arranged in one readback column, they can be accessed with one operation. A sorting of memory locations therefore occurs before the generation of the FPGA hardware configuration.

In an embodiment of the invention, the method comprises the additional step of optimizing the FPGA hardware configuration with the arrangement of memory locations, containing states for a signal value, in adjacent areas of the FPGA. Adjacent areas can concern a single readback column of the FPGA or a plurality of adjacent readback columns. Access to the memory locations is accelerated by the adjacent arrangement. If memory locations for two signal values are arranged in one readback column, both can be accessed with one operation. This also applies to write accesses, whereby only signal values can be written to the FPGA that are present therein at least temporarily in a memory location.

In an embodiment of the invention, the method comprises the additional step of adding memory locations at outputs of logic blocks for providing status data. The memory locations, typically registers, enable the reading of status data in order to determine signal values therefrom. Access to an increased number of signal values can occur in the case of an increased number of available status data.

In an embodiment of the invention, the FPGA is a Xilinx FPGA. The Xilinx FPGA offers, apart from the possibility of the repeated configuration of the FPGA, likewise the possibility of the partial reading and configuration of the FPGA during operation.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
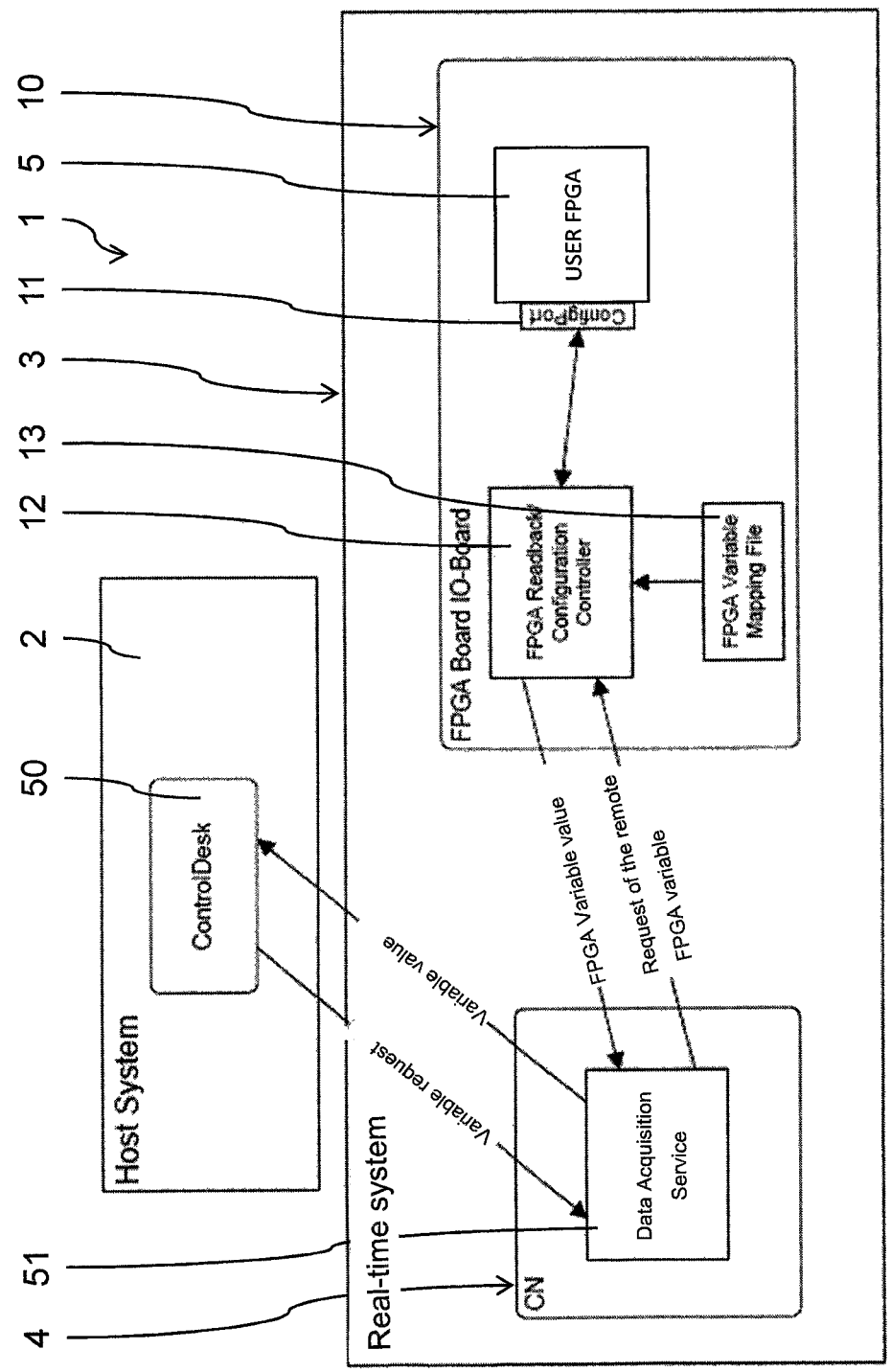
FIG. 1 shows a schematic diagram of a data processing system with a control computer and a real-time system.

FIG. 1 shows an inventive structure of a data processing system 1 with a control computer 2, here also labeled as host system, and a real-time system 3. Real-time system 3 is connected to control computer 2 over a network connection which is not shown explicitly.

Figure 2:
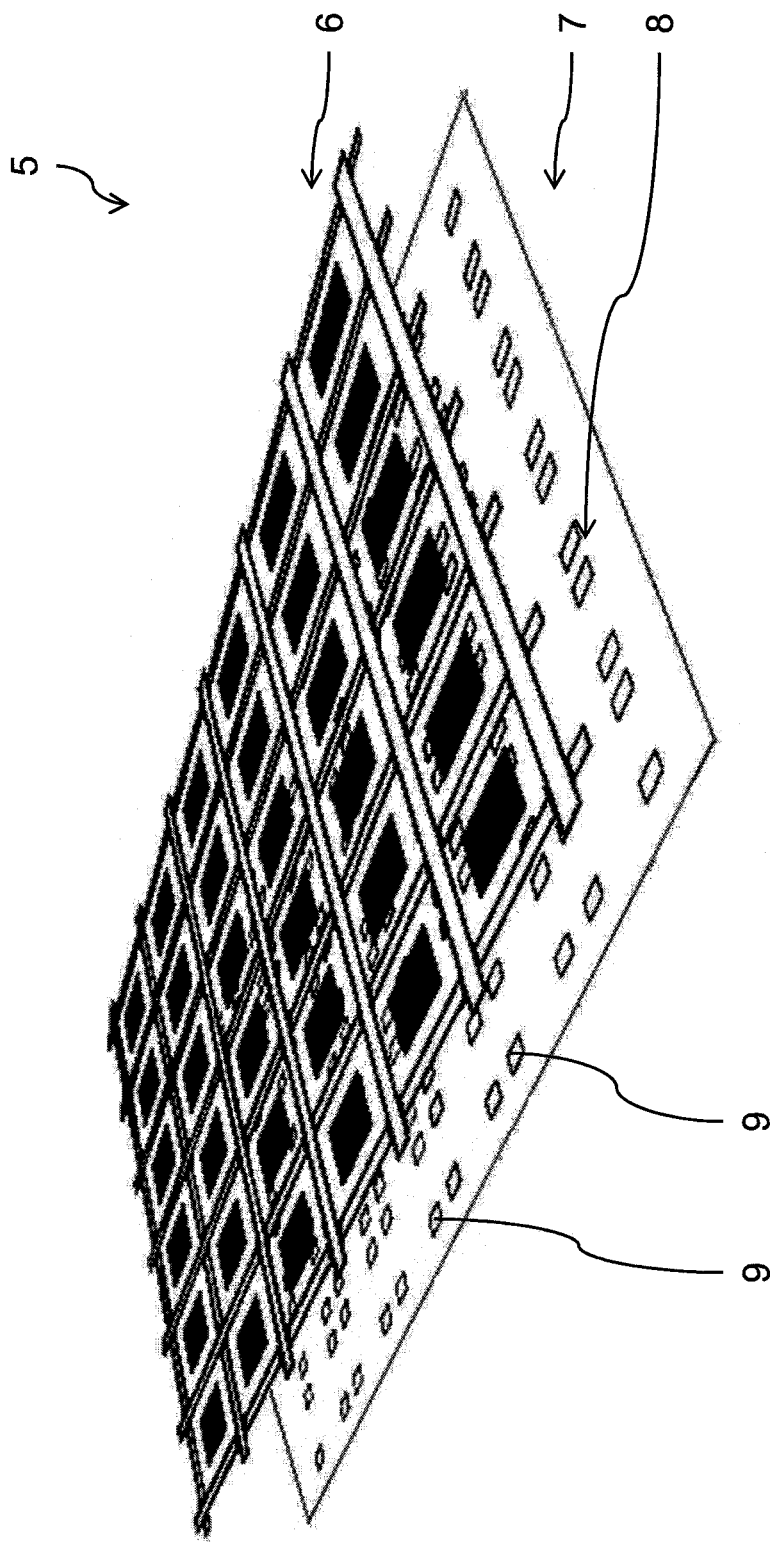
FIG. 2 shows a detailed view of an FPGA of the real-time systems from FIG. 1.

Real-time system 3 comprises a computation node 4, also labeled as CN, with a CPU (not shown) and an FPGA 5, which in this exemplary embodiment is a Xilinx FPGA. Real-time system 3 here is any data processing device. FPGA 5 is shown schematically in FIG. 2 and comprises a functional level 6 and a configuration level 7. A configuration memory 8 with a plurality of memory locations 9 is arranged in configuration level 7. Configuration level 7 is a logic level of FPGA 5 for its initialization. During an initial configuration process, configuration data are written to configuration memory 8 and sent to functional level 6. Memory locations 9 correspond to registers of FPGA 5.

FPGA 5 is arranged on an FPGA board 10 and connected via an interface 11 to a controller 12 for access to interface 11. Interface 11 here has a width of 32 bits at a clock frequency of 100 MHz with a minimal read amount of one frame. A frame may contain, apart from register values, information on a look-up table and on multiplexer or wiring configuration. An FPGA variable mapping file 13 for access by controller 12 is stored on FPGA board 10.

Figure 3:
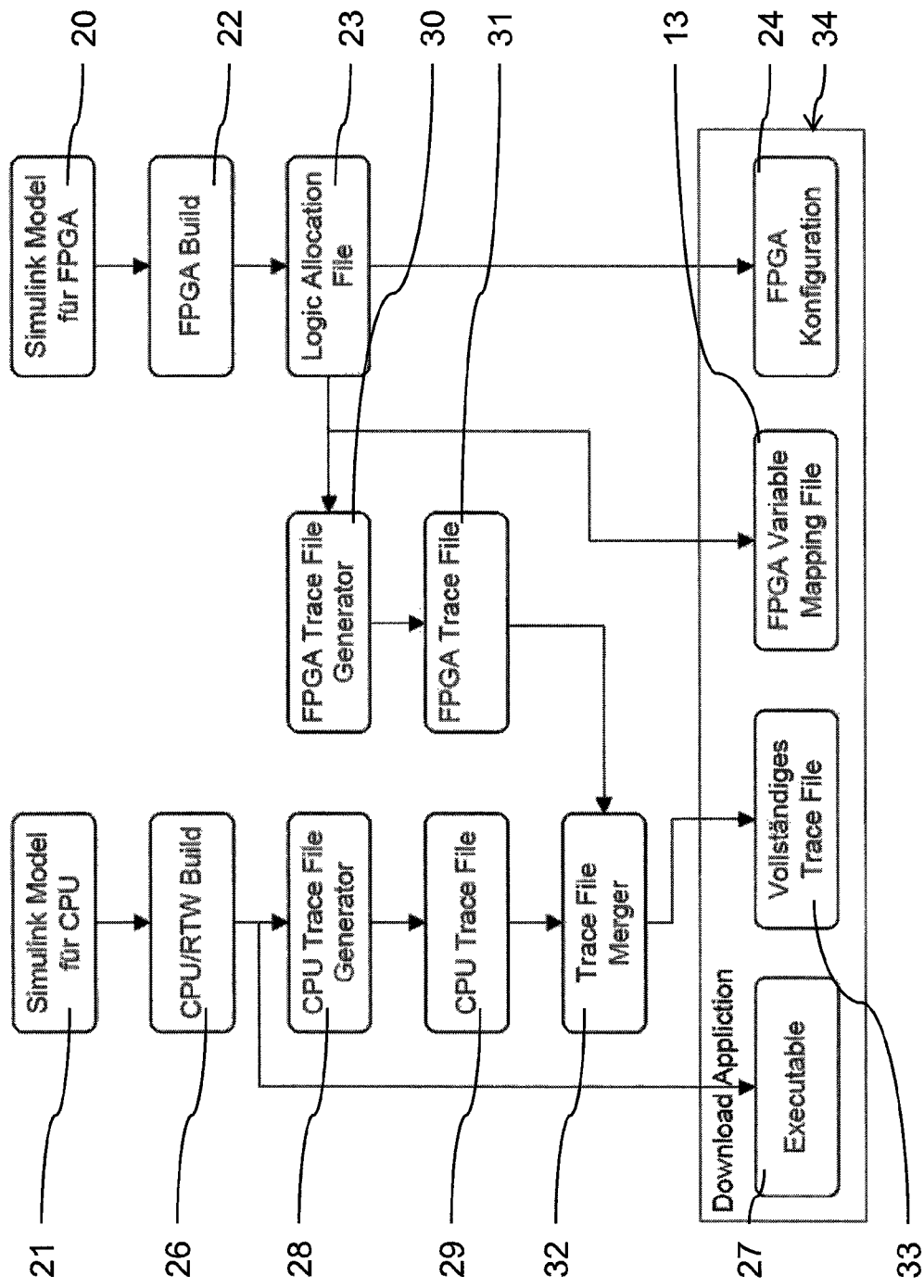
FIG. 3 shows a diagram of a method for making a build for the real-time systems from FIG. 1.

For the utilization of real-time system 3, a build is made as described below with reference to FIG. 3. An FPGA model 20 and a CPU model 21, both of which were generated with Simulink, are used as the starting basis for the build. A common hardware description language, a logic allocation file 23, and an FPGA hardware configuration 24 are generated from FPGA model 20 in an FPGA build 22 using VHDL. A list with memory locations 9 of configuration memory 8 for status data of signal values accessible in FPGA 5 at runtime is stored in logic allocation file 24. Linkages of memory locations 9 to form the signal values are also determined and stored in logic allocation file 24, so that a signal value can be determined from status data proceeding from logic allocation file 24.

The aforementioned machine-readable FPGA variable mapping file 13, which contains the allocations of memory locations 9 to signal values in a machine-readable form, is generated from logic allocation file 24. An application 27 executable on the CPU of real-time system 3 is created from CPU model 21 in a CPU build 26. A CPU trace file 29 is generated in a CPU trace file generator 28 in addition proceeding from CPU build 26. An FPGA trace file 31 is generated analogously in an FPGA trace file generator 30. In a further step, trace files 29, 31 are merged in a trace file merger 32 into an entire trace file 33.

The build method supplies as the overall result a download application 34 for real-time system 3 with application 27, entire trace file 33, FPGA variable mapping file 13, and FPGA hardware configuration 24.

Figure 4:
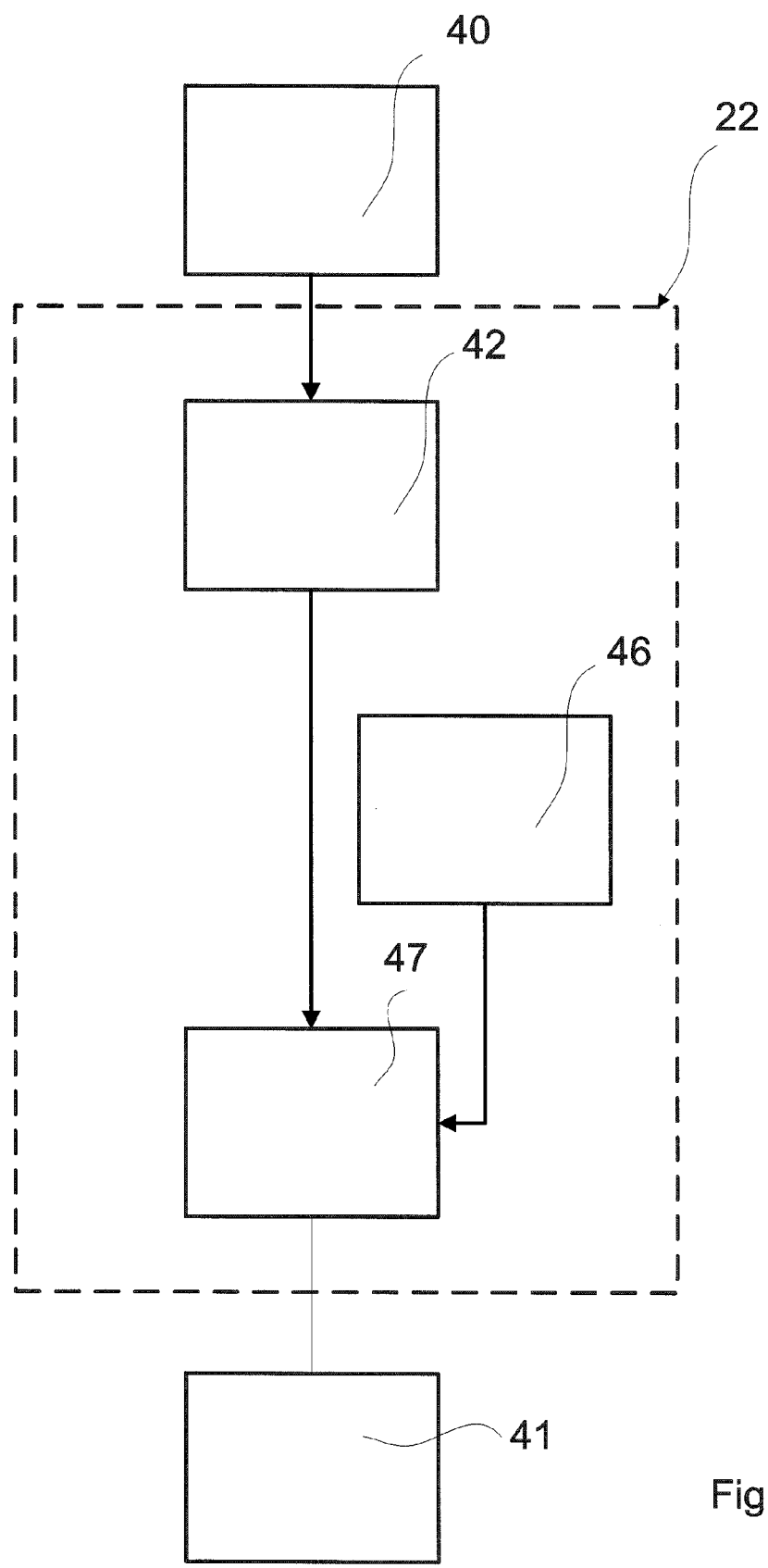
FIG. 4 shows a detailed view of an FPGA build from FIG. 3.

FPGA Build 22 is shown in detail in FIG. 4. FPGA build 22 receives as input a block diagram 40 of an FPGA subsystem, which comprises a combination of primitive blocks such as addition, multiplication, etc. The result of the process is a Model.ini file 41, which contains the completed bitstream and an interface description. The interface description contains a list of all interfaces, which are instantiated in the FPGA subsystem. CPU interfaces corresponding to the FPGA interfaces can be generated from this description. An HDL description 42, which in this exemplary embodiment is a VHDL description, is generated in the first step of FPGA build 22 from block diagram 40 of the FPGA subsystem by Xilinx System Generator (XSG). This description is then converted into a netlist by a synthesis tool.

The netlist of the Simulink model is merged with the remaining readback framework component 46, necessary for the readback functionality, into a complete netlist 47. The overall design is then converted into a bitstream by an implementation process and saved in Model.ini file 41.

A relationship is created between the block outputs of the Simulink block diagram and the FPGA components (D-flip-flops) or memory locations 9 belonging to the FPGA components in configuration memory 8. This diagram is successively built or refined during the FPGA build 22 and stored by FPGA trace file generator 30 in an FPGA trace file 31.

If the block diagram of an FPGA subsystem is converted by the XSG to an HDL, these two descriptions are similar in regard to their structure. This can be used to create a direct relation between, e.g., a block output of a Simulink block and a port of an HDL entity.

Figure 5:
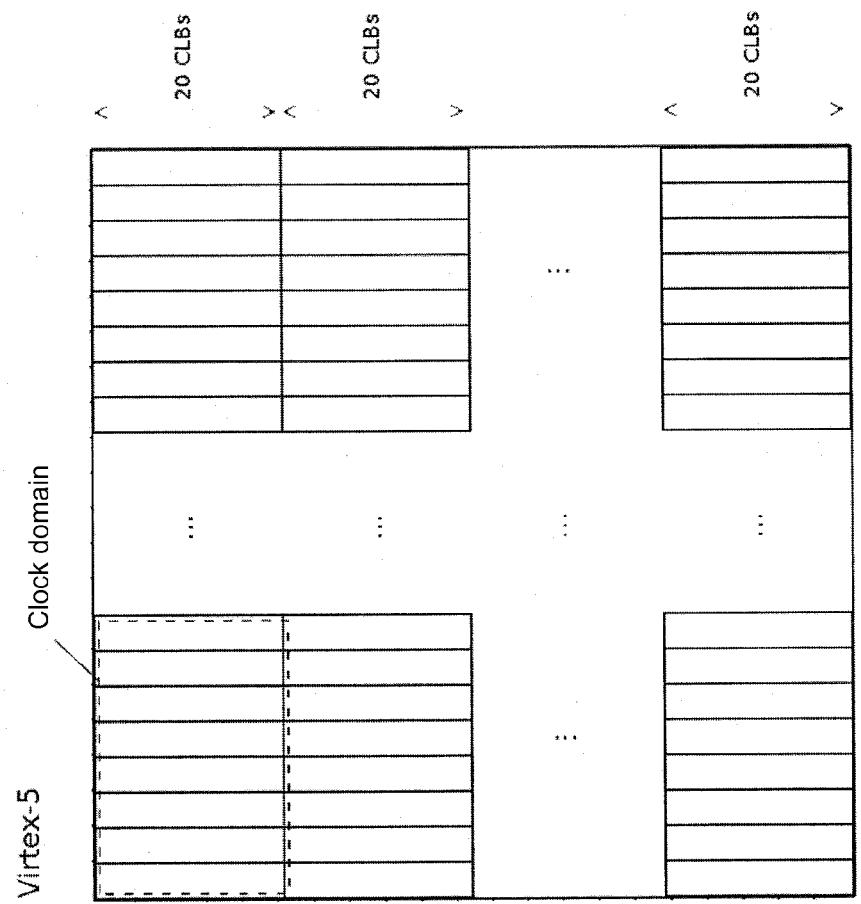
FIG. 5 shows a detailed view of the organization of the configuration memory of the FPGA from FIG. 2 in readback columns.

The method comprises in addition the optimization of FPGA hardware configuration 24 with the arrangement of memory locations 9, containing status data for a signal value, in a readback column of FPGA 5. The organization of configuration memory 8 in readback columns is shown in FIG. 5. A frame comprises a 1-bit-wide and 1312-bit-long column in configuration memory 8 and extends over a CLB column of functional level 6. A correlation between a bit within a frame and the functional element that it configures can be determined by the Xilinx tools. Therefore, only one part of the frame is of interest for determining a signal value. The arrangement in a readback column accelerates access to the status data for a signal value. If all memory locations 9 for a signal value are arranged in one readback column, these can be accessed with one operation.

Figure 6:
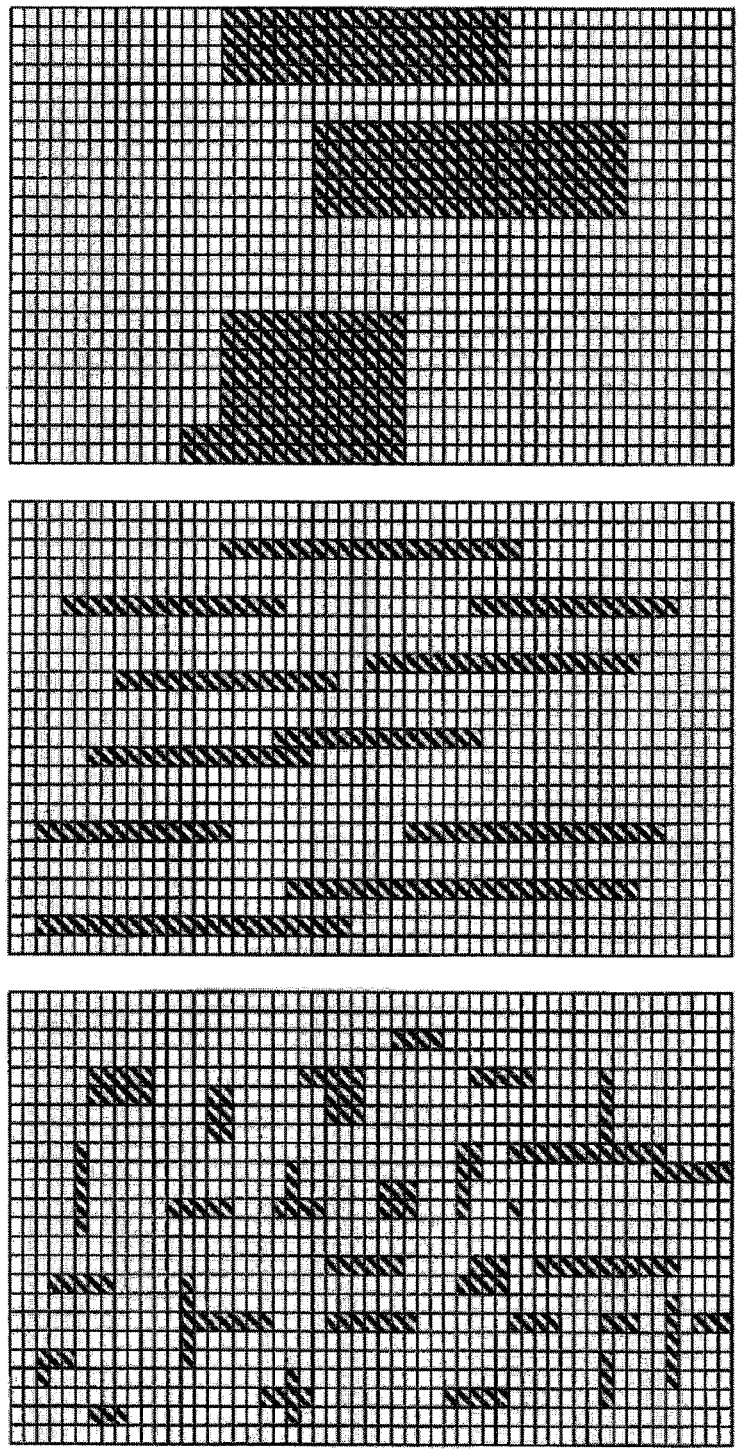
FIG. 6 shows a schematic diagram of relevant memory contents in readback columns of the configuration memory, whereby the left diagram shows a distribution without optimization, the middle diagram an optimization with a concentration of relevant memory locations in readback columns, and the right diagram an optimization with an adjacent arrangement of relevant readback columns.

As is shown in FIG. 6, left diagram, relevant readback columns are first distributed over the entire configuration memory 8. Memory locations 9, which contain states for a signal value, are arranged in adjacent areas of FPGA 5 by optimizing FPGA hardware configuration 24. Adjacent areas can relate to a single readback column of FPGA 5 or a plurality of adjacent readback columns. Access to memory locations 9 is accelerated by the adjacent arrangement. By an arrangement of memory locations 9 for two signal values within a readback column, both are accessed with one operation. FIG. 6, middle diagram, shows an optimization with a concentration of relevant memory locations 9 in a reduced number of readback columns. According to FIG. 6, right diagram, in a further optimization the relevant readback columns are arranged in addition adjacently in FPGA 5.

Figure 7:
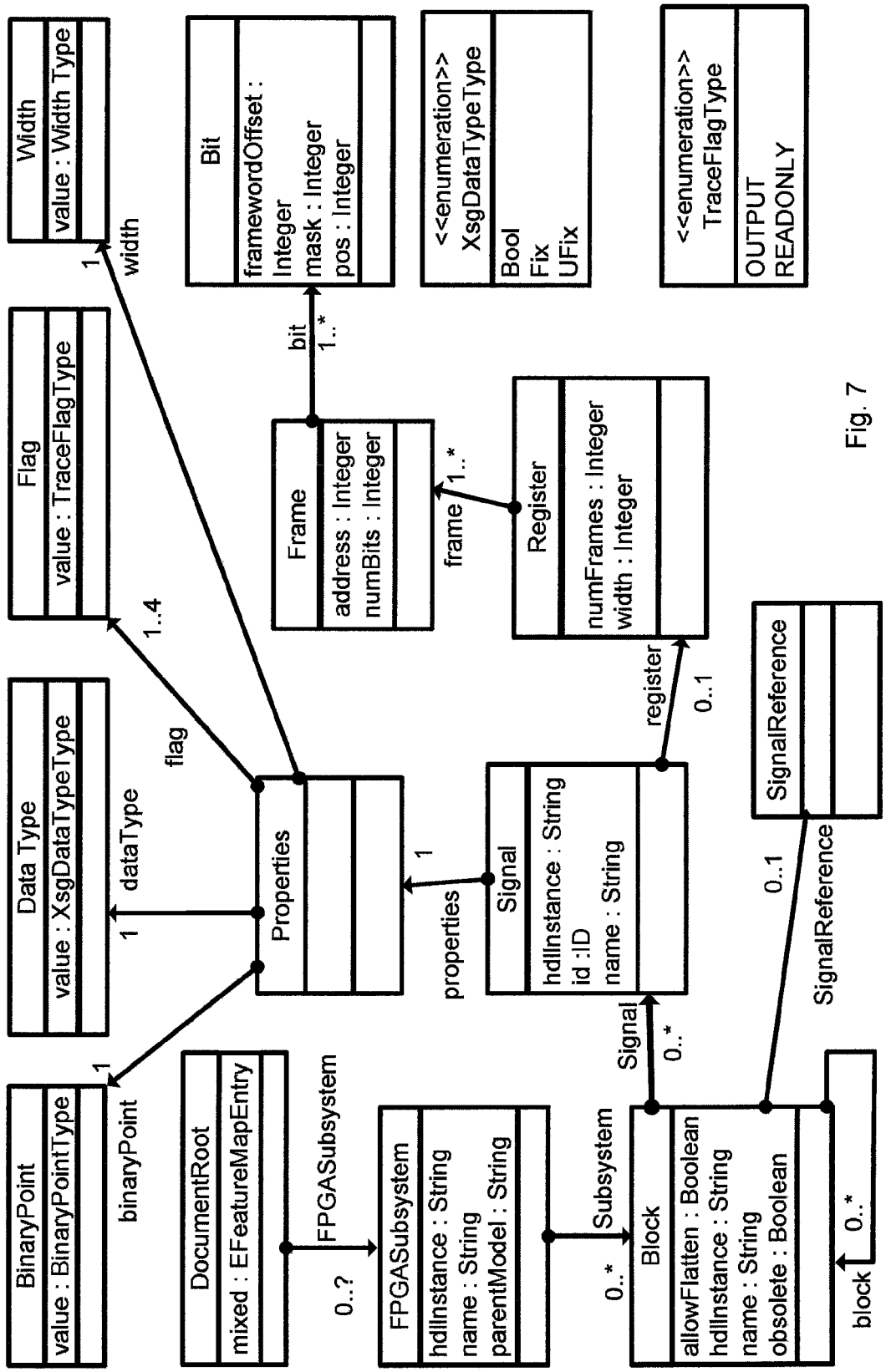
FIG. 7 shows a model-like representation of all information important for the method, such as the hierarchy of the FPGA model, bit width, and binary point positions of the signals, as well as the address information of the individual registers in the FPGA configuration memory.

A model-like representation of all information important for the method, such as the hierarchy of the FPGA model, bit width, and binary point position of the signals, and the address information of the individual register in the FPGA configuration memory is shown in FIG. 7.

An element of the FPGA subsystem type forms the root of each readback model instance. The FPGA subsystem in accordance with the model hierarchy of Simulink contains recursively further subsystem instances. A subsystem in this context can be configured both as a primitive block (e.g., adder) and as a Simulink subsystem. A name of a subsystem or block and the name of the associated HDL entity are stored in the properties name or HDL instance of the subsystem class.

Each subsystem can comprise a number of signals, which represent signals or I/O ports in the Simulink model. Each signal receives a unique identifier using the ID property. Because the direction of the signals (in/out) plays no role and redundancies are to be avoided in modeling, the signal class by convention represents the outputs of the blocks or subsystems in the Simulink model. If more subsystems share the same signals, reference can be made via an instance of the signal reference class to signals of other subsystem instances.

A signal can be associated with a register by the synthesis. This association is again found between the signal and register class. The relationship between a register and the frames in which the initial values of the register are stored is modeled using the corresponding classes. The properties of a signal are modeled using the properties class. Primarily the properties of binary point, data type, and width are relevant for the readback and subsequent preparation of the signals.

A register element is associated with a number of bits using the frame class. The register, like the signal, has its own width property, because the width of a signal and the width of the associated register may vary. A bit first indicates by the bit position (pos) the bit of the register in question. In addition, a bit instance contains information on the word (frame word offset) in which the register bit is located within the frame and on the bit mask (mask) with which the value of the bit from the frame word can be masked.

The readback model is stored in an XML file. Thus, the model can be processed using multiple tools. The model by the validation against an XSD schema is kept syntactically and structurally correct.

The method comprises the additional step of generating an FPGA code 44 as a readback application for determining a signal value, whereby the FPGA code 44 comprises the reading of the status data from configuration memory 8 as readback data and the determining of the signal value from the readback data based on the FPGA variable mapping file 13.

Figure 8:
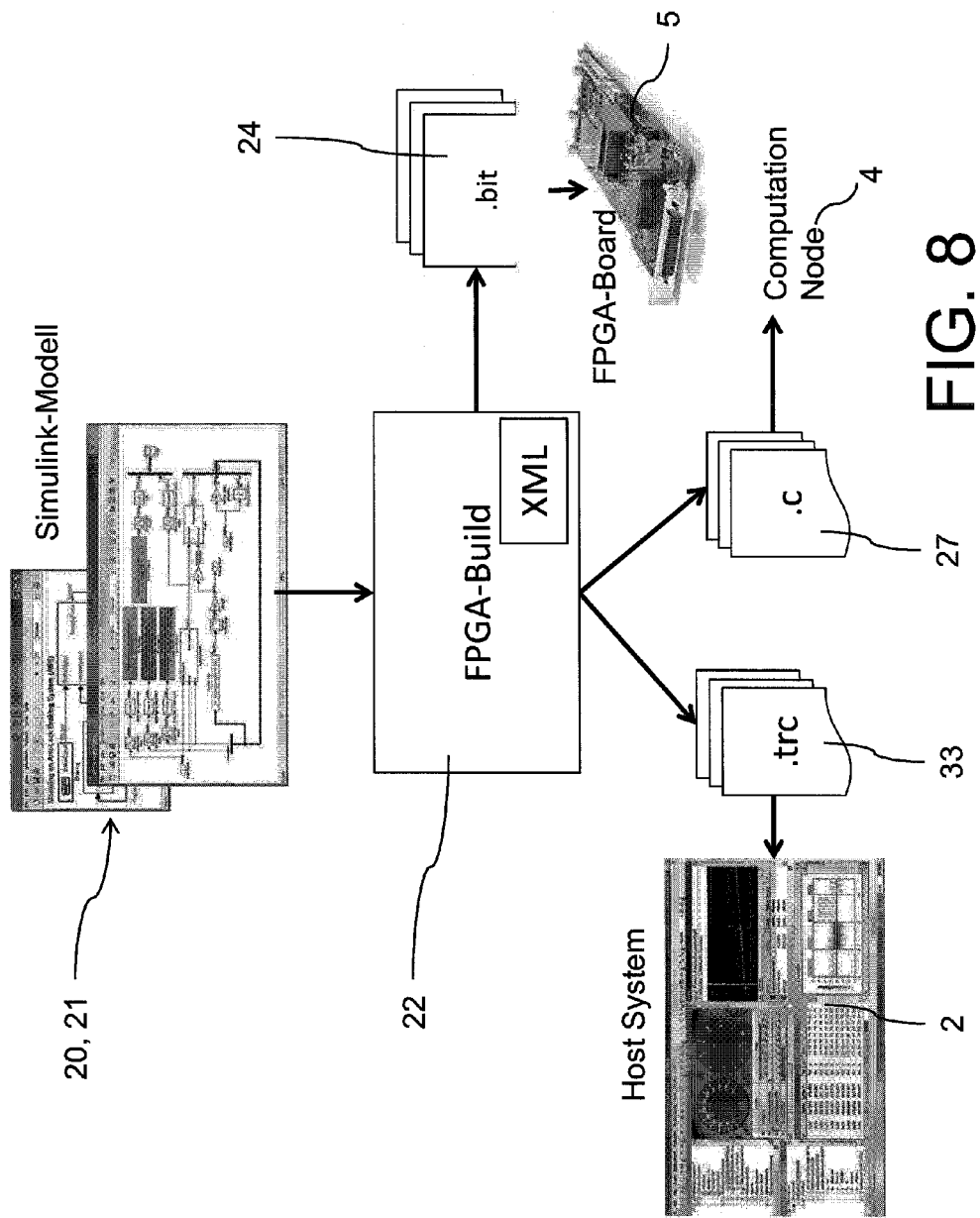
FIG. 8 shows a distribution of the results of the build method from FIG. 3 to the different components of the data processing system from FIG. 1.

FIG. 8 shows the distribution of the results of the build process among the different components. A build with an FPGA build 22 is made from the Simulink model 20, 21. An FPGA hardware configuration 24 is generated and loaded into FPGA 5. Application 27 is loaded into computation node 4, and the entire trace file 33 is sent to control computer 2.

During operation, FPGA hardware configuration 24 is started and executed in FPGA 5. Application 27 is started and executed in computation node 4. A control software 50, which in this exemplary embodiment is a dSPACE ControlDesk software, is started in control computer 2. ControlDesk 50 communicates with real-time system 3 over computation node 4, as is shown in FIG. 1.

To display a signal value of FPGA 5 during runtime, it can be requested via ControlDesk 50. The access to different signal values occurs via the entire trace file 33 and a graphical modeling with Simulink. The presentation of the signal value occurs as a graphical presentation, whereby the signal value is dragged from a list by "drag and drop" to the shown instruments for displaying signal values. The signal value is identified from the list with a unique identification number.

The signal value is requested by ControlDesk 50 from computation node 4. To this end, a data acquisition service 51, which receives the request from ControlDesk 50, is implemented in computation node 4. The signal value is requested from data acquisition service 51 by controller 12 for FPGA 5. During the operation of FPGA 5, this initiates the sending of status data from functional level 6 of FPGA 5 to its configuration memory 8. Thus all register contents of functional level 6 are mirrored in configuration level 7 by a trigger during operation. In an alternative embodiment, status data parts necessary for determining the signal value are identified from FPGA variable mapping file 13 and only these parts are backed up in configuration memory 8.

Further, status data from configuration memory 8 are read as readback data in FPGA 5 by readback application 44. The read readback data here comprise one or more frames, i.e., one or more readback columns of FPGA 5. In this regard, readback columns, which are necessary for determining the signal value, are identified first and only these readback columns are read. This information on the necessary readback columns is determined from FPGA variable mapping file 13.

The signal value is determined in FPGA 5 based on the readback data. To this end, register values are searched for and extracted from the frames. The information follows from FPGA variable mapping file 13. The mapping of the readback data to at least one register value occurs. In this regard, the signal value is formed if necessary from the status data of a number of registers. Accordingly, the contents of a register are processed together according to FPGA variable mapping files 13, in order to determine the signal value.

The thus determined signal value is sent via interface 11 of FPGA 5 to controller 12, which sends the signal value via data acquisition service 51 of computation node 4 to ControlDesk 50 of control computer 2.

In analogy to the read access, described above, to a signal value of FPGA 5, a write access is also possible. In this case, a signal value is selected for sending to FPGA 5. Write-back data, which are sent as status data to configuration memory 8 of FPGA 5, are determined from the signal value. The status data are sent from configuration memory 8 to functional level 6 of FPGA 5. The previously described details on the read access to FPGA 5 can be used in each case individually accordingly for the write access.

The method is implemented as a computer program product with computer-implemented instructions, said product which after storing and execution in real-time system 3 performs the steps of the above method.

A digital storage medium provides electronically readable control signals, which interact with real-time system 3, so that the above method is executed in real-time system 3.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for accessing a signal value of an FPGA (Field programmable gate array) at runtime, the method comprising:
  loading an FPGA hardware configuration into the FPGA;
  executing the FPGA hardware configuration in the FPGA;
  requesting a signal value of the FPGA;
  sending status data from a functional level of the FPGA to a configuration memory in its configuration level;

reading the status data from the configuration memory as readback data; and determining the signal value from the readback data.

2. The method according to claim 1, wherein the step of determining the signal value from the readback comprises mapping the readback data to at least one register value.

3. The method according to claim 1, wherein the step of determining the signal value from the readback data comprises determining the signal value from at least one register value.

4. The method according to claim 1, wherein the step of reading the status data from the configuration memory as readback data comprises identifying areas, necessary for determining the signal value, of the configuration memory and reading the status data of the necessary areas of the configuration memory as readback data.

5. The method according to claim 1, wherein the step of sending status data from a functional level of the FPGA to a configuration memory in its configuration level comprises identifying the status data parts, necessary for determining the signal value, and backing up these parts of the status data in its configuration memory.

6. The method according to claim 1, wherein the step of requesting the signal value of the FPGA comprises providing a list of available signal values and selecting a signal value from the list.

7. The method according to claim 1, further comprising:
setting a signal value for sending to the FPGA;
determining write-back data from the signal value;
writing the write-back data as status data in the configuration memory of the FPGA; and
sending the status data from the configuration memory to the functional level of the FPGA.

8. A data processing device comprising:
a processor unit; and
an FPGA (Field programmable gate array),
wherein the data processing device is configured with instructions to perform:
loading an FPGA hardware configuration into the FPGA;
executing the FPGA hardware configuration in the FPGA;
requesting a signal value of the FPGA;
sending status data from a functional level of the FPGA to a configuration memory in its configuration level;
reading the status data from the configuration memory as readback data; and
determining the signal value from the readback data.

9. The data processing device according to claim 8, wherein the FPGA is a Xilinx FPGA.

10. A non-transitory computer readable storage medium storing instructions thereon that, when executed by a computer, cause the computer to perform a method for accessing a signal value of an FPGA (Field programmable gate array) at runtime, the method comprising:
loading an FPGA hardware configuration into the FPGA;
executing the FPGA hardware configuration in the FPGA;
requesting a signal value of the FPGA;
sending status data from a functional level of the FPGA to a configuration memory in its configuration level;
reading the status data from the configuration memory as readback data; and
determining the signal value from the readback data.

* * * * *